US 9,548,411 B2

(12) United States Patent
Nielson et al.

(10) Patent No.: US 9,548,411 B2
(45) Date of Patent: Jan. 17, 2017

(54) PHOTOELECTROCHEMICALLY DRIVEN SELF-ASSEMBLY METHOD

(71) Applicant: Sandia Corporation, Albuquerque, NM (US)

(72) Inventors: Gregory N. Nielson, Albuquerque, NM (US); Murat Okandan, Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 427 days.

(21) Appl. No.: 14/061,576

(22) Filed: Oct. 23, 2013

(65) Prior Publication Data

US 2014/0261613 A1    Sep. 18, 2014

Related U.S. Application Data

(60) Provisional application No. 61/789,998, filed on Mar. 15, 2013.

(51) Int. Cl.
*H01L 31/05* (2014.01)
*H01L 27/142* (2014.01)
(Continued)

(52) U.S. Cl.
CPC ......... *H01L 31/0504* (2013.01); *H01L 27/142* (2013.01); *H01L 31/0475* (2014.12);
(Continued)

(58) Field of Classification Search
CPC .. H01L 31/18; H01L 31/0504; H01L 31/1892; H01L 27/142; H01L 31/0475; H01L 31/0604; H01L 31/1876; Y02E 10/50; Y02P 70/521
See application file for complete search history.

(56) References Cited

U.S. PATENT DOCUMENTS 4,315,973 A * 2/1982 Manassen ............... C25B 1/003
204/278.5
5,545,291 A * 8/1996 Smith ................... G02F 1/1362
257/E21.505
(Continued)

FOREIGN PATENT DOCUMENTS

WO    WO 2012/088194 A1    6/2012

OTHER PUBLICATIONS

"Alien Technology Corporation White Paper: Fluidic Self Assembly," Retrieved at <<http://venturebeat.fiies,wordpress.com/2008/10/alienfsa_white_paper.pdf>>, Oct. 1999, pp. 1-7.
(Continued)

*Primary Examiner* — Carl Arbes
(74) *Attorney, Agent, or Firm* — Martin I. Finston

(57) ABSTRACT

Various technologies described herein pertain to assembling electronic devices into a microsystem. The electronic devices are disposed in a solution. Light can be applied to the electronic devices in the solution. The electronic devices can generate currents responsive to the light applied to the electronic devices in the solution, and the currents can cause electrochemical reactions that functionalize regions on surfaces of the electronic devices. Additionally or alternatively, the light applied to the electronic devices in the solution can cause the electronic devices to generate electric fields, which can orient the electronic devices and/or induce movement of the electronic devices with respect to a receiving substrate. Further, electrodes on a receiving substrate can be biased to attract and form connections with the electronic devices having the functionalized regions on the surfaces. The microsystem can include the receiving substrate and the electronic devices connected to the receiving substrate.

20 Claims, 11 Drawing Sheets

(51) Int. Cl.
  *H01L 31/18* (2006.01)
  *H01L 31/0475* (2014.01)
(52) U.S. Cl.
  CPC *H01L 31/1876* (2013.01); *H01L 2224/95145* (2013.01); *Y02E 10/50* (2013.01); *Y02P 70/521* (2015.11)

(56) References Cited

U.S. PATENT DOCUMENTS

| | | | | |
|---|---|---|---|---|
| 5,824,186 | A * | 10/1998 | Smith | G02F 1/1362 216/2 |
| 6,507,989 | B1 * | 1/2003 | Bowden | H01L 24/95 257/E21.705 |
| 6,555,741 | B1 * | 4/2003 | Hopkins | H01G 9/2031 136/244 |
| 6,780,696 | B1 * | 8/2004 | Schatz | H01L 24/95 257/688 |
| 7,774,929 | B2 * | 8/2010 | Jacobs | H01L 24/31 29/825 |
| 2004/0115696 | A1 | 6/2004 | Heller | |
| 2006/0223205 | A1 * | 10/2006 | Jacobs | H01L 24/95 438/22 |
| 2006/0228739 | A1 | 10/2006 | Seul | |
| 2008/0108159 | A1 | 5/2008 | Ajiki et al. | |
| 2009/0087139 | A1 | 4/2009 | Ty Tan et al. | |

OTHER PUBLICATIONS

Srinivasan, et al., "Fluidic Self-Assembly of Micromirrors onto Surface Micromachined Actuators", 2000 IEEE/LEOS International Conference on Optical MEMS, 2000, p. 1-4.

Bohringer, Karl F., "Surface Modification and Modulation in Microstructures: Controlling Protein Adsorption, Monolayer Desorption and Micro-Self-Assembly", Journal of Micromechanics and Microengineering, vol. 13, 2003, pp. S1-S10.

PCT Application App. No. PCT/US2014/025616, filed on Mar. 13, 2014 with the International Searching Authority, International Search Report mailed Aug. 26, 2014, pp. 1-7.

* cited by examiner

PHOTOELECTROCHEMICALLY DRIVEN SELF-ASSEMBLY METHOD

CROSS-REFERENCE TO RELATED APPLICATION

This application claims the benefit of U.S. Provisional Patent Application Ser. No. 61/789,998, filed Mar. 15, 2013, and entitled "PHOTOELECTROCHEMICALLY DRIVEN SELF ASSEMBLY", the entirety of which is incorporated herein by reference.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Microsystems are commonly assembled utilizing pick-and-place techniques. Pick-and-place assembly oftentimes utilize robotic systems that mechanically move and place devices on a receiving substrate. However, when assembling microsystems, pick-and-place techniques may be time consuming (e.g., due to serial assembly) and may encounter difficulties due to adhesive forces between manipulator surfaces and the devices.

More recently, various self-assembly techniques have been employed for forming microsystems. Self-assembly techniques are commonly carried out in one or more solutions (e.g., devices and a receiving substrate are disposed in the solution(s) during assembly). Some conventional self-assembly techniques utilize shape matching. Accordingly, a first type of device and a first subset of receptor sites on the receiving substrate can have corresponding shapes, a second type of device and a second subset of receptor sites on the receiving substrate can have corresponding shapes, and so forth. Such techniques can rely on random movement of the devices in the solution(s), leading to the devices fitting in corresponding receptor sites on the receiving substrate that have matching shapes. Other conventional self-assembly approaches utilize hydrophilic and hydrophobic surface interactions to drive self-assembly. However, conventional self-assembly techniques are often time consuming (e.g., self-assembly may take on the order of hours for assembly to complete, particularly if self-assembly is based on random movement of devices fitting into receptor sites on the receiving substrate). Moreover, yields of conventional self-assembly techniques are commonly insufficient.

SUMMARY

Described herein are various technologies that pertain to assembling electronic devices into a microsystem. The electronic devices include photovoltaic cells. The electronic devices can also have additional functionalities. The electronic devices can be disposed in a solution. Light can be applied to the electronic devices in the solution. The electronic devices can generate currents responsive to the light applied to the electronic devices in the solution. Moreover, the currents can cause electrochemical reactions that functionalize regions on surfaces of the electronic devices. Further, electrodes on a receiving substrate can be biased to attract and form connections with the electronic devices having the functionalized regions on the surfaces. Thus, the microsystem can include the receiving substrate and the electronic devices connected to the receiving substrate.

In accordance with various embodiments, light applied to the electronic devices in a solution (e.g., the solution in which the electronic devices are functionalized, a differing solution) can cause the electronic devices to generate electric fields. The electric fields generated responsive to application of the light to the electronic devices can orient the electronic devices with respect to the receiving substrate and/or induce movement of the electronic devices with respect to the receiving substrate. Thus, the electric fields can enable orientation and/or movement of the electronic devices to be controlled to facilitate assembling the electronic devices into the microsystem.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
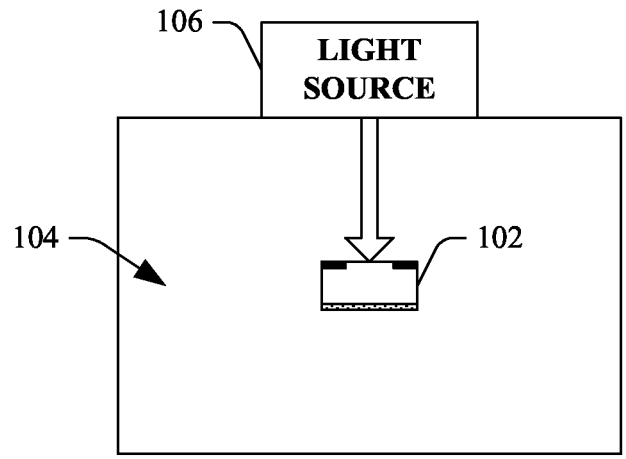
FIGS. 1-3 illustrate an exemplary system for self-assembling electronic devices into a microsystem.

Various technologies pertaining to photoelectrochemically driven self-assembly of microsystems are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 2:
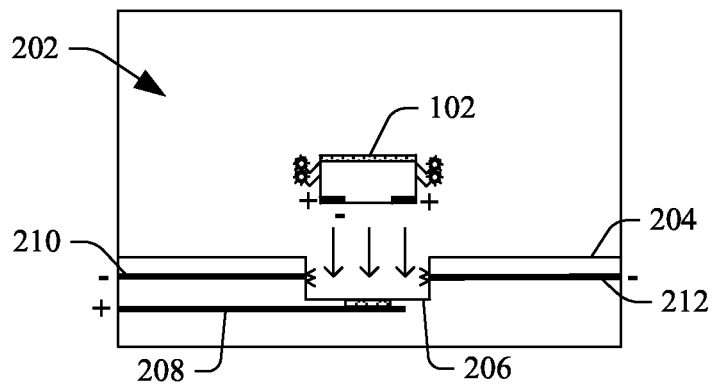
Figure 3:
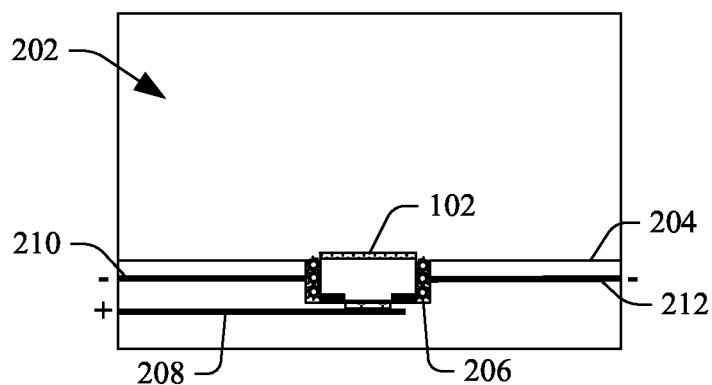

Referring now to the drawings, FIGS. 1-3 illustrate an exemplary system for self-assembling electronic devices into a microsystem. The electronic devices include photovoltaic cells. Moreover, the electronic devices can additionally have other functionalities. Upon being assembled, the microsystem can include a receiving substrate and electronic devices connected to the receiving substrate. The microsystem, for instance, can be a solar array. It is noted that many of the examples set forth herein describe one electronic device (e.g., in a solution, attracted to and/or forming connections with the receiving substrate, etc.). It is to be appreciated, however, that such examples are intended to be extended to scenarios that include more than one electronic device.

As illustrated in FIG. 1, an electronic device 102 is disposed in a solution 104. For instance, the solution 104 can be retained in a reaction chamber. Further, a light source 106 can apply light to the electronic device 102 in the solution 104. The light source 106 can be a broadband light source that can be produced by pass-band optical filters, for example. According to another example, the light source 106 can be a monochromatic source (e.g., a laser).

The electronic device 102 includes photovoltaic cells. In addition to inclusion of the photovoltaic cells, the electronic device 102 can be fabricated to provide additional functionality. According to an example, the light from the light source 106 can drive photoelectrochemical functionalization of regions on a surface of the electronic device 102. Additionally or alternatively, the light from the light source 106 can cause the electronic device 102 to generate an electric field responsive to the light applied to the electronic device 102 from the light source 106.

In FIG. 2, the electronic device 102 is disposed in a solution 202. According to an example, the solution 202 can be the solution 104 of FIG. 1. Pursuant to another example, the solution 202 can differ from the solution 104 of FIG. 1.

A receiving substrate 204 is disposed in the solution 202 in FIG. 2. Although not shown, it is contemplated that the receiving substrate 204 can similarly be disposed in the solution 104 of FIG. 1 (as well as other Figures that do not depict the receiving substrate 204). The receiving substrate 204 can include a receptor site 206 having a shape that corresponds to a shape of the electronic device 102; yet, the claimed subject matter is not so limited. Moreover, the receiving substrate 204 includes electrodes 208-212. It is contemplated that the electrodes 208-212 can be functionalized or plain.

As illustrated in FIG. 2, the electronic device 102 has functionalized regions on its surface. The functionalization of the regions on the surface of the electronic device 102 can result from electrochemical reactions driven by the light from the light source 106 applied to the electronic device 102 as shown in FIG. 1; however, other techniques can additionally or alternatively be employed to functionalize the regions on the surface of the electronic device 102.

As part of self-assembly of the microsystem, the electrodes 208-212 on the receiving substrate 204 can be biased to attract and form connections with the electronic device 102. For instance, the electrodes 208-212 can be biased to attract and form connections with the electronic device 102 having the functionalized regions on the surface.

FIG. 3 illustrates the electronic device 102 and the receiving substrate 204 with a connection formed there between. According to an example, a reaction can occur between a surface of the receptor site 206 and the surface of the electronic device 102 (e.g., due at least in part to reactivity of the functionalized regions on the surface of the electronic device 102, functionalized regions on the surface of the receptor site 206, etc.) to form the connection between the electronic device 102 and the receiving substrate 204. Additionally or alternatively, it is contemplated that further reactions can be affected to strengthen the connection between the electronic device 102 and the receiving substrate 204.

Figure 4:
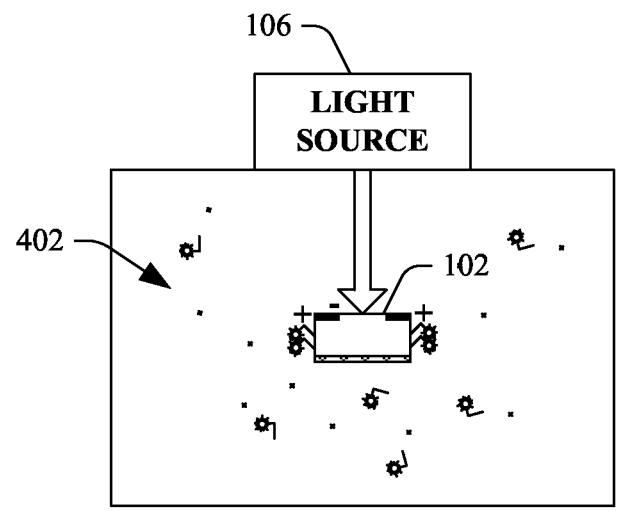
FIG. 4 illustrates an exemplary light source applying light to an exemplary electronic device to drive functionalization of regions on a surface of the electronic device.

As noted above in connection with FIG. 1, the light applied to the electronic device 102 by the light source 106 can functionalize regions on the surface of the electronic device 102. More particularly, as shown in FIG. 4, the electronic device 102 can be disposed in a solution 402 (e.g., the solution 402 can be the solution 104 of FIG. 1). The solution 402 can be an ionic, conductive solution.

Accordingly, the light source 106 can apply the light to the electronic device 102 in the solution 402. The electronic device 102 can generate current responsive to the light applied to the electronic device 102 in the solution 402. Further, the current can cause electrochemical reactions that functionalize regions on a surface of the electronic device 102. Various characteristics of the regions on the surface of the electronic device 102 can be modified responsive to being functionalized. Examples of such characteristics include surface charge, reactivity, hydrophilicity, hydrophobicity, oleophilicity, oleophobicity, and so forth.

Functionalization of regions on the surface of the electronic device 102 can be driven by photoelectrochemical reactions. The photoelectrochemically driven functionalization of regions on the surface of the electronic device 102 can allow for simplified and versatile schemes for selectively assembling dissimilar components via self-assembly. With the application of light from the light source 106, n and p contacts (e.g., electrodes) of the electronic device 102 can charge to different potentials (e.g., p to positive, n to negative), which drive electrochemical reactions that passivate and/or functionalize such regions on the surface of the electronic device 102 (and/or insulating regions on the surface of the electronic device 102).

In fabrication of a self-assembling microsystem, functionalization and/or passivation of surfaces can enable controlling the assembly of the microsystem. Regions (e.g., the n contact, the p contact, portions of the insulating regions, etc.) on the surface of the electronic device 102 can be selectively functionalized with different chemistries, surface charges, etc. Further, wavelength of incoming light supplied by the light source 106 can be controlled, reactants in the solution 402 can be selected, and so forth, which can enable self-assembly to be more repeatable and flexible. Thus, the specificity and driving forces behind the assembly can be more controllable when compared to conventional self-assembly techniques used for fluidic self-assembly. Moreover, using the photoelectrochemical reactions to prepare the surfaces can be less costly compared to the conventional approaches.

Subsequent to functionalization, additional reactions can be carried out in following rinse/reaction steps, which can add chemicals and/or layers to differing regions of the electronic device 102. Moreover, subsequent to functionalization, further reactions can be driven by illuminating the electronic device 102 with the light from the light source 106. For instance, orientation and/or movement of the electronic device 102 in solution, attachment of the electronic device 102 to the receiving substrate 204, and/or strengthening a bond between the electronic device 102 and other components (e.g., the receiving substrate 204 with the biased electrodes 208-212) can be controlled responsive to the light supplied by the light source 106 being applied to the electronic device 102.

Figure 5:
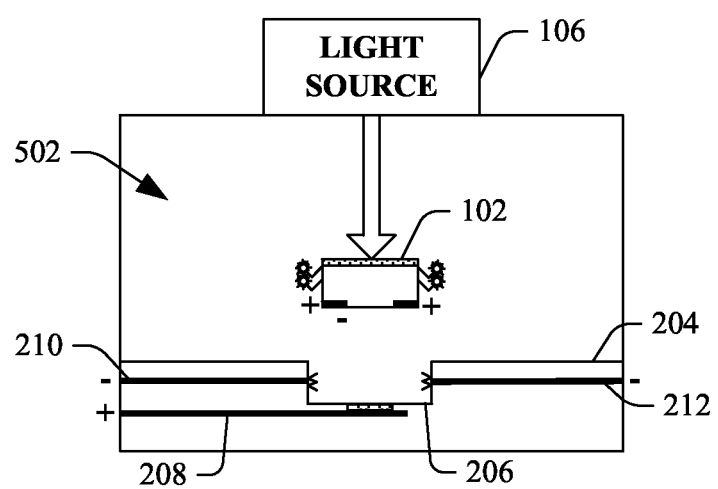
FIG. 5 illustrates the light source applying light to the electronic device to cause the electronic device to generate an electric field.

Further, as set forth herein in connection with FIG. 1, it is noted that the light from the light source 106 applied to the electronic device 102 can cause the electronic device 102 to generate an electric field. As shown in FIG. 5, light from the light source 106 can be applied to the electronic device 102 to generate an electric field. FIG. 5 depicts the electronic device 102 being disposed in a solution 502 (e.g., the solution 502 can be the solution 104 of FIG. 1). By way of example, the solution 502 can be the solution 402 of FIG. 4 (e.g., the solution 502 can be an ionic, conductive solution). Pursuant to another example, the solution 502 can differ from the solution 402 of FIG. 4 (e.g., the solution 502 can be a non-ionic, non-conductive solution).

The electronic device 102 can generate an electric field responsive to the light from the light source 106 being applied to the electronic device 102 in the solution 502. For instance, the electric field can be internal to the electronic device 102. Additionally or alternatively, an external electric field (e.g., created within the solution 502) can be generated by the electronic device 102 responsive to the light applied from the light source 106. The electric field can orient the electronic device 102 with respect to the receiving substrate 204. Additionally or alternatively, the electric field can induce movement of the electronic device with respect to the receiving substrate 204.

By way of an example, an external electric field (e.g., created by a field generator) can be in place within the solution 502. When the light source 106 applies the light to the electronic device 102, the electronic device 102 can orient itself in a minimum energy configuration within the external electric field due to the electric field created by the electronic device 102. Accordingly, the electronic device 102 can be oriented and/or moved responsive to application of the light by the light source 106. Additionally or alternatively, the electric field generated by the electronic device 102 responsive to application of the light by the light source 106 can cause other electronic device(s), charged particles, etc. within the solution 502 to orient themselves and/or induce movement of such other electronic device(s), charged particles, etc.

According to various embodiments, functionalization of regions on the surface of the electronic device 102 (FIG. 4) and generation of the electric field by the electronic device 102 (FIG. 5) can be carried out within a common solution (e.g., the solution 402 can be the same as the solution 502, an ionic, conductive solution). For instance, the light source 106 can apply the light to the electronic device 102 in the solution, and the electronic device 102 can generate current responsive to the light applied by the light source 106. The current can cause electrochemical reactions that functionalize regions on the surface of the electronic device 102. The electrochemical reactions can further cause the electrodes of the electronic device 102 to be passivated, which can inhibit subsequent current flow. Upon the electrodes being passivated, further electrochemical reactions may no longer occur responsive to the light being applied from the light source 106 to the electronic device 102; rather, additional light applied by the light source 106 to the electronic device 102 can lead to voltage build up, which can cause an electric field to be generated as described herein. Accordingly, the electronic device 102 can pass current while electron transport by the electrodes of the electronic device 102 is possible, and after electron transport is blocked (e.g., by an insulator or some other layer being formed upon the surface of the electronic device 102) charge resulting from the light being applied to the electronic device 102 can generate an electric field. Thus, pursuant to an illustration, if the solution includes a plurality of electronic devices, a subset of the electronic devices may generate current to drive electrochemical reactions responsive to applied light at a given time, while a disparate subset of the electronic devices may concurrently generate an electrical field responsive to the light at such given time.

In accordance with other embodiments, the functionalization of regions on the surface of the electronic device 102 (FIG. 4) can be effectuated in the solution 402 during self-assembly. Thereafter, the electronic device 102 can be removed from the solution 402 and later disposed in the solution 502 (e.g., the solution 402 and the solution 502 can differ). It is contemplated that other processing steps can be performed subsequent to removal of the electronic device 102 from the solution 402 and prior to disposing in the solution 502; yet, the claimed subject matter is not so limited. Upon being disposed in the solution 502, the electric field by can be generated by the electronic device 102 in the solution 502 (FIG. 5) during the self-assembly.

In yet other embodiments, it is to be appreciated self-assembly can include functionalizing regions on the surface of the electronic device 102 utilizing the light from the light source 106 (FIG. 4) without creating the electrical field with the electronic device 102 responsive to light from the light source 106. According to other embodiments, it is contemplated that self-assembly can include creating the electric field with the electronic device 102 utilizing the light from the light source 106 (FIG. 5) without functionalizing regions on the surface of the electronic device 102 responsive to light from the light source 106 (FIG. 4).

Figure 6:
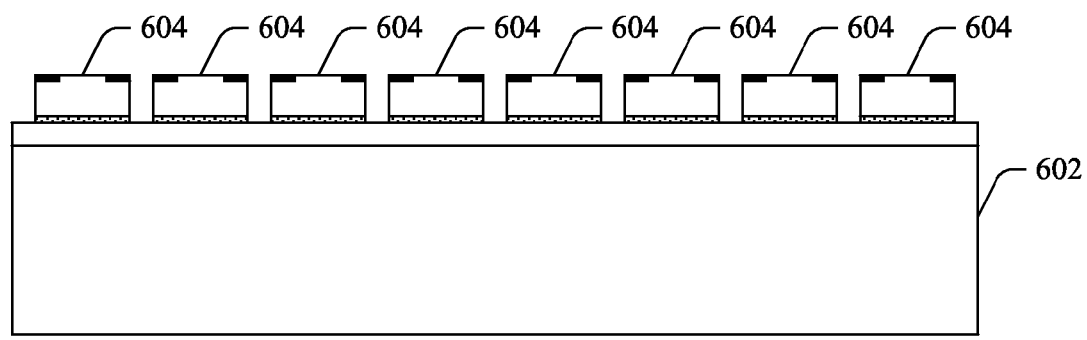
FIG. 6 illustrates an exemplary fabrication surface with a plurality of electronic devices fabricated thereupon.

FIG. 6 illustrates an exemplary fabrication surface 602 with a plurality of electronic devices 604 (e.g., the electronic device 102, etc.) fabricated thereupon. The electronic devices 604 can be formed in a device layer of a silicon-on-insulator wafer (e.g., the fabrication surface 602). While eight electronic devices 604 are depicted in FIG. 6, it is contemplated that substantially any number of electronic devices can be fabricated on the fabrication surface 602.

Figure 7:
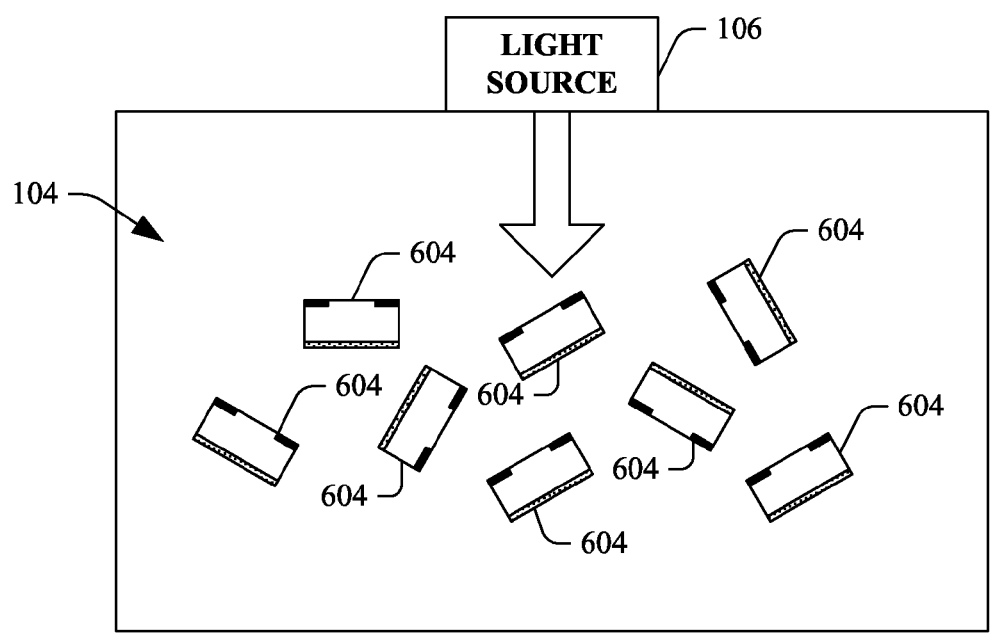
FIG. 7 illustrates the electronic devices of FIG. 6 being released from the fabrication surface and disposed in a solution for subsequent functionalization.

According to various embodiments, the electronic devices 604 on the fabrication surface 602 can be released from the fabrication surface 602 (e.g., prior to functionalization of regions on surfaces of the electronic devices 604). As illustrated in FIG. 7, the electronic devices 604 released from the fabrication surface 602 can be disposed in the solution 104. Accordingly, light from the light source 106 can be applied to the electronic devices 604 in the solution 104 subsequent to the electronic devices 604 being released from the fabrication surface 602. The light can be applied from the light source 106 to the electronic devices 604 to at least partially functionalize regions on surfaces of the electronic devices 604.

Figure 8:
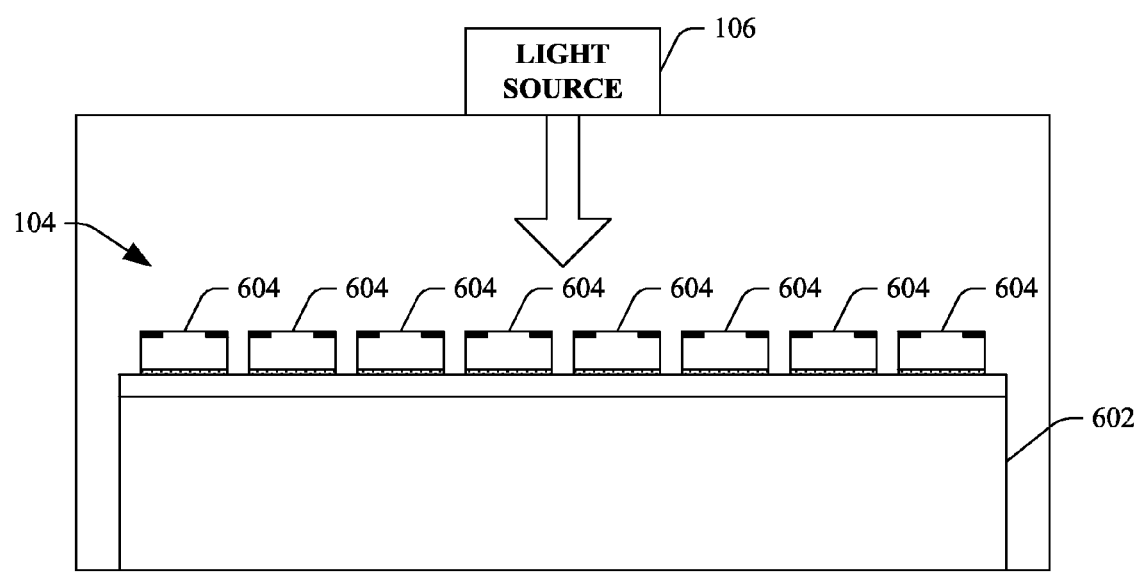
FIG. 8 illustrates the electronic devices of FIG. 6 being functionalized while on the fabrication surface.
Figure 9:
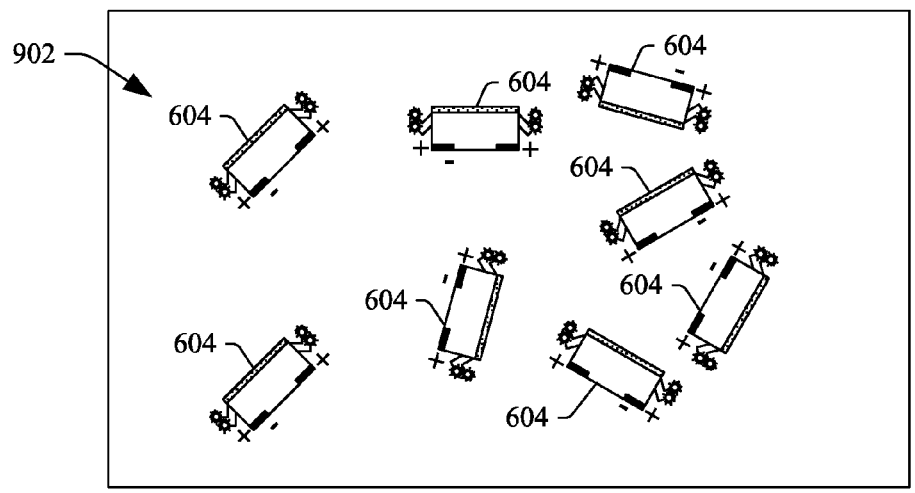
FIG. 9 illustrates the electronic devices being released from the fabrication surface subsequent to functionalization as set forth in FIG. 8.

According to other embodiments, the electronic devices 604 fabricated on the fabrication surface 602 as shown in FIG. 6 can be at least partially functionalized while still attached to the fabrication surface 602 (e.g., partially released). As illustrated in FIG. 8, the electronic devices 604 can be disposed in the solution 104 (e.g. the solution 402 of FIG. 4) while the electronic devices 604 are attached to the fabrication surface 602. The light source 106 can apply the light the electronic devices 604 in the solution 104 while the electronic devices 604 are attached to the fabrication surface 602 to at least partially functionalize the regions on the surfaces of the electronic devices 604. Subsequent to the application of the light from the light source 106 to the electronic devices 604 in the solution 104 while the electronic devices 604 are attached to the fabrication surface 602, the electronic devices 604 can be released from the fabrication surface 602 as shown in FIG. 9. For instance, the electronic devices 604 released from the fabrication surface 604 can be disposed in a solution 902 (e.g., the solution 902 can be the solution 402 or the solution 502).

According to yet other embodiments, it is contemplated that the electronic devices 604 can be partially functionalized while still attached to the fabrication surface 602 by applying light as shown in FIG. 8. Thereafter, the electronic devices 604 can be released from the fabrication surface 602 and disposed in the solution 902. The light source 106 can apply light to the electronic devices 604 in the solution 902 (as shown in FIG. 7) to cause further functionalization of regions on the surfaces of the electronic devices 604.

Further, as described above in connection with FIG. 2, upon being functionalized, the electronic device 102 can be attracted to the receiving substrate 204. According to an example, it is contemplated that characteristics of regions on the surface of the electronic device 102 (upon being functionalized) can cause the electronic device 102 to orient within the solution 202 with respect to the receiving substrate 204 and/or induce movement of the electronic device 102 with respect to the receiving substrate 204 within the solution 202 (e.g., due to interaction of the electronic device 102 as functionalized with the solution 202). For instance, hydrophilicity, hydrophobicity, oleophilicity, or oleophobicity of regions on the surface of the electronic device 102 can cause such orientation and/or movement of the electronic device 102 with respect to the receiving substrate 204.

Figure 10:
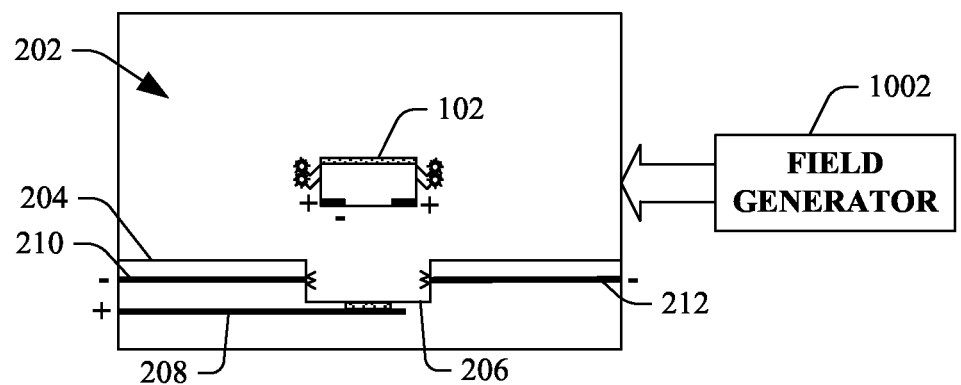
FIGS. 10-13 illustrate various exemplary systems for orienting and/or moving electronic device(s) with respect to a receiving substrate in a solution.

According to another example, as illustrated in FIG. 10, a field generator 1002 can supply an electric field (e.g., an external electric field) to the solution 202 (e.g., the solution 502 of FIG. 5) in which the electronic device 102 and the receiving substrate 204 are disposed. The external electric field supplied by the field generator 1002 can cause the electronic device 102 to orient with respect to the receiving substrate 204 and/or induce movement of the electronic device 102 with respect to the receiving substrate 204 (e.g., due to surface charge of regions on the surface of the electronic device 102). Moreover, the electrodes 208-212 on the receiving substrate 204 can be biased to further attract and form connections with the electronic device 102. Thus, the electric field generated by the field generator 1002, as well as the electrodes 208-212 on the receiving substrate 204 being biased, can cause the electronic device 102 to be attracted to the receptor site 206 and/or appropriately aligned with respect to the receptor site 206. Upon reaching the receptor site 206, a connection can be formed between the electronic device 102 and the receiving substrate 204.

Figure 11:
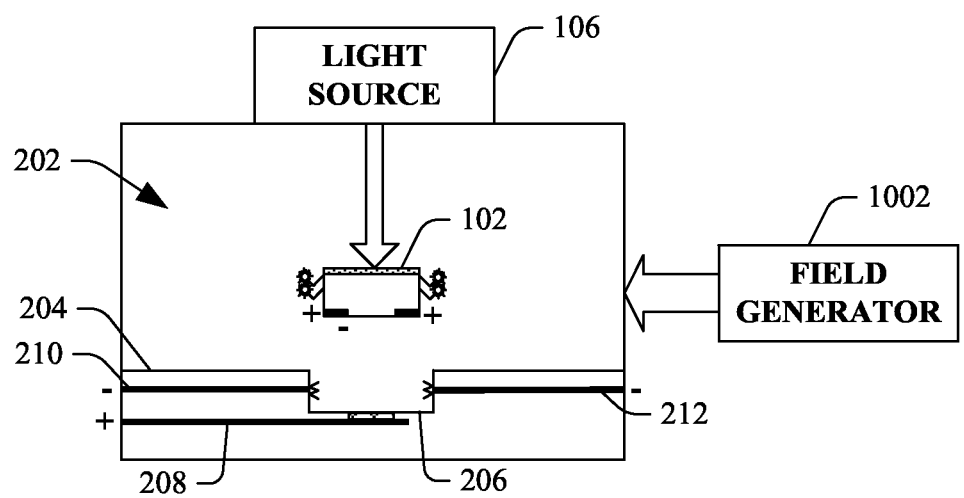

Further, as shown in FIG. 11, the light source 106 can apply light to the electronic device 102 in the solution 202 (e.g., the solution 502) while the field generator 1002 supplies the external electric field to the solution 202. In accordance with this example, the light applied to the electronic device 102 in the solution 202 can cause the electronic device 102 to generate an electric field. The electric field generated by the electronic device 102 responsive to the light from the light source 106 can cause the electronic device 102 to orient itself in a minimum energy configuration within the external electric field supplied by the field generator 1002. Additionally or alternatively, movement of the electronic device 102 can be induced by the external electric field generated by the field generator 1002 when the electronic device 102 generates the electric field responsive to light applied by the light source 106. Accordingly, the incoming light from the light source 106 can cause the p and n regions of the electronic device 102 to build charge, and the surface charge previously imparted (e.g., during the functionalization of the regions of the surface of the electronic device 102) can assist in driving assembly of the microsystem.

Figure 12:
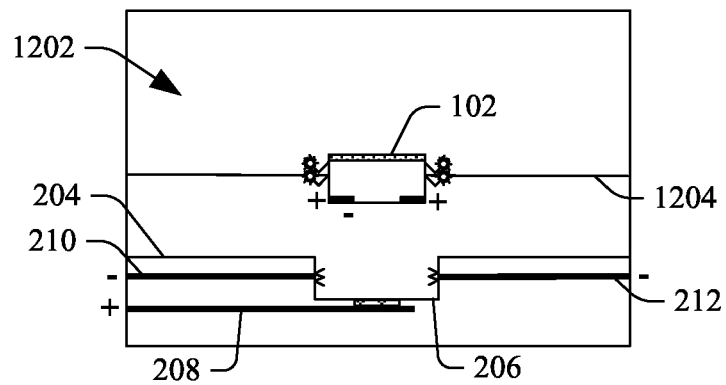

According to another example, as illustrated in FIG. 12, the electronic device 102 can be disposed in a two-part solution 1202 (e.g., the solution 202 of FIG. 2). Interaction of the electronic device 102 and the two-part solution 1202 can cause the electronic device 102 to orient at an interface 1204 between solutions in the two-part solution 1202 (e.g., due to hydrophilicity, hydrophobicity, oleophilicity, or oleophobicity of regions on the surface of the electronic device 102). From the position at the interface between the solutions in the two-part solution 1202, movement of the electronic device 102 can be induced employing one or more of the approaches described herein (e.g., external electric field, application of light, mechanically, a combination thereof, etc.).

Moreover, according to various embodiments, it is contemplated that mechanical guiding and/or orienting of the electronic device 102 within a solution can be employed as part of the assembly of the microsystem. For instance, the electronic device 102 can be mechanically guided to the electrodes 208-210 on the receiving substrate 204. Additionally or alternatively, the electronic device 102 can be mechanically oriented with respect to the receiving substrate 204.

Figure 13:
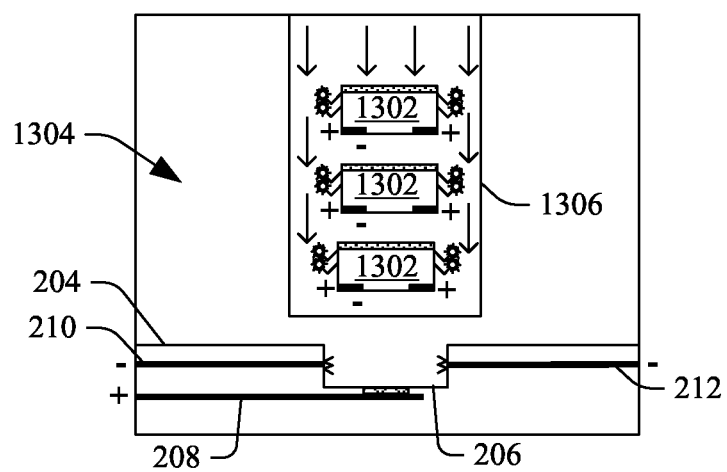

FIG. 13 depicts an example of mechanical guiding of electronic devices 1302 that can be employed as part of the assembly of a microsystem described herein. The electronic device 1302 can be disposed in a solution 1304. Moreover, the electronic devices 1302 are functionalized as described herein. The solution 1304 and the electronic devices 1302 can flow through a channel 1306. By flowing through the channel 1306, the electronic devices 1302 can be arranged in a column format for presentation to receptor sites of the receiving substrate 204. It is to be appreciated, however, that the claimed subject matter is not limited to use of a channel 1306 oriented as shown in FIG. 13 (e.g., the electronic devices 1302 can be aligned in differing patterns other than a column, etc.).

Once the electronic device 102 is in contact with the electrodes 208-212 on the receiving substrate 204, further reactions can be affected to strengthen the connection between the electronic device 102 and receiving substrate 204. It is contemplated that a chemical reaction can occur between the receiving substrate 204 and the electronic device 102. For instance, such reaction can be facilitated by the reactivity of the functionalized regions on the surface of the electronic device 102; however, the claimed subject matter is not so limited.

Figure 14:
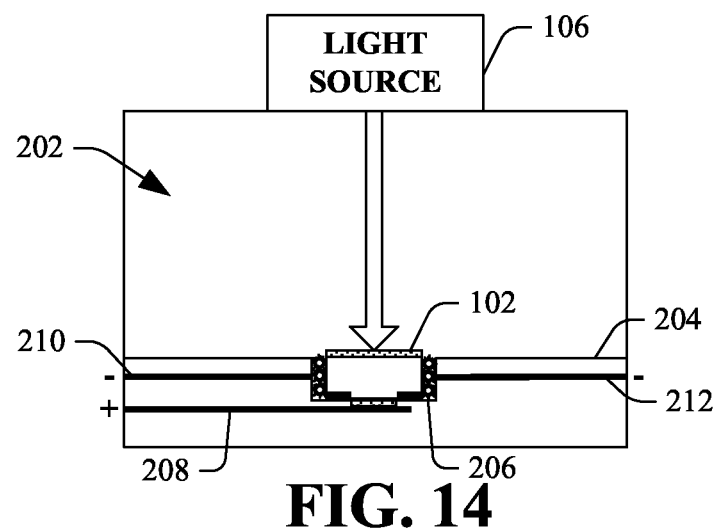
FIGS. 14-15 illustrate various exemplary systems for strengthening a connection between the electronic device and the receiving substrate.

Additionally or alternatively, as shown in FIG. 14, the light source 106 can apply light to the electronic device 102 when the electronic device 102 is connected to the receiving substrate 204 to strengthen the connections between the electronic device 102 and the receiving substrate 204. The light from light source 106 can provide in-situ modification after assembly of the microsystem. It is contemplated, according to an example, that the light source 106 can provide higher photon flux for such modification after the electronic device 102 is connected to the receiving substrate 204 to strengthen the connection there between; yet, the claimed subject matter is not so limited. By way of example, the light source 106 can be a laser that can thermally drive firing of screen printed paste and/or epoxy contacts; yet, the claimed subject matter is not so limited.

Figure 15:
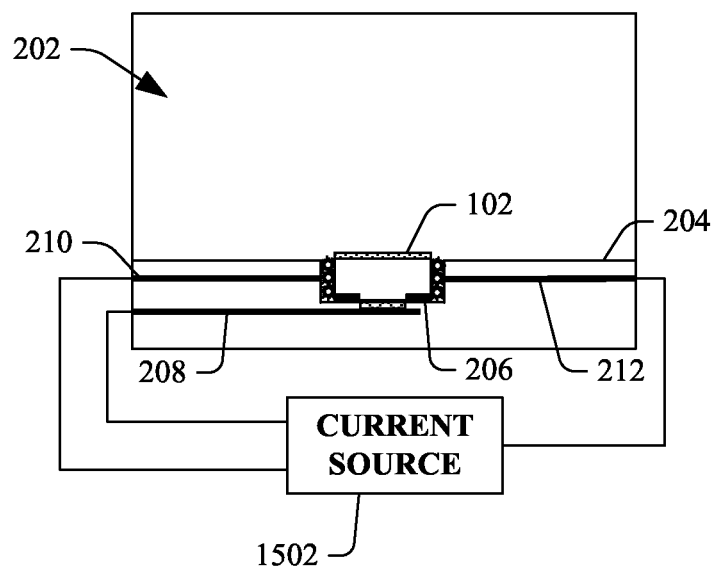

Pursuant to another example, as depicted in FIG. 15, the connection between the electronic device 102 and the receiving substrate 204 can be strengthened by supplying electrical current between the electrodes 208-212 on the receiving substrate 204. A current source 1502 can supply the electrical current between the electrodes 208-212 on the receiving substrate. The electrical current can further pass through the electronic device 102 connected to the receiving substrate 204 at the receptor site 206. Thus, the current source 1502 can supply the electrical current between the electrodes 208-212 to strengthen the connection between the electronic device 102 and the receiving substrate 204 subsequent to formation of the connection between the electronic device 102 and the receiving substrate 204.

Figure 16:
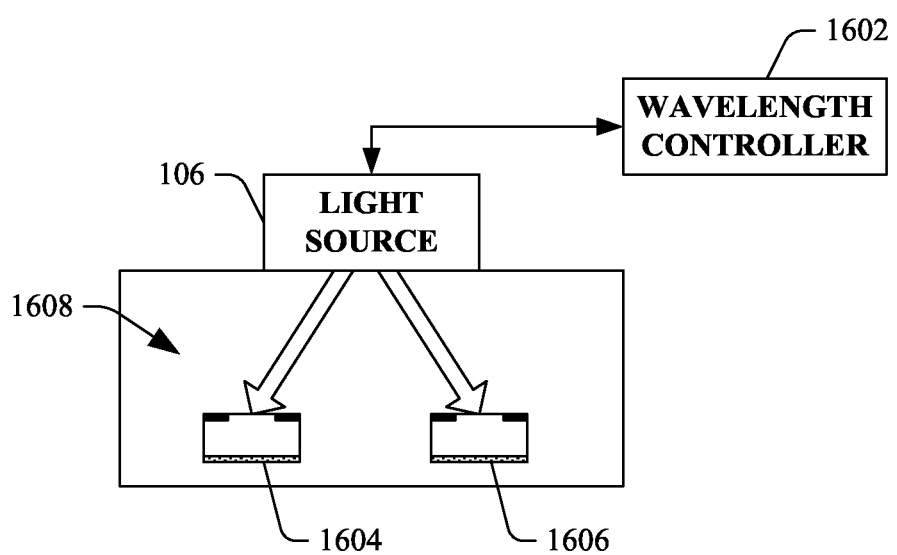
FIG. 16 illustrates an exemplary system for controlling wavelength of the light source to control assembly of the microsystem.

Reference is now made to FIG. 16, which illustrates the light source 106 being controlled by a wavelength controller 1602. The wavelength controller 1602 can control a wavelength of the light emitted by the light source 106. Electronic devices that include photovoltaic cells formed from different types of material can absorb differing wavelengths of light. Accordingly, functionalization and/or assembly can be driven by selectively controlling wavelength delivered to the photovoltaic cells of the electronic devices. As shown in FIG. 16, the light source 106 can apply light to an electronic device 1604 and an electronic device 1606. The electronic device 1604 and the electronic device 1606 can include photovoltaic cells made of differing materials (e.g., silicon, gallium arsenide, etc.).

According to an example, the wavelength controller 1602 can cause the light source 106 to apply a first wavelength of the light to the electronic devices in a solution 1608 (e.g., the solution 402 of FIG. 4). The first wavelength of the light can cause selective functionalization of the regions on the surfaces of a first subset of the electronic devices (e.g., the electronic device 1604 can be functionalized whereas the electronic device 1606 is not functionalized by the first wavelength of light). Thereafter, the wavelength controller 1602 can apply a second wavelength of the light to the electronic devices in the solution 1608. The second wavelength of the light can cause selective functionalization of the regions on the surfaces of a second subset of the electronic devices (e.g., the electronic device 1606 can be functionalized whereas the electronic device 1604 is not functionalized responsive to application of the second wavelength of the light).

Similarly, the wavelength of the light controlled by the wavelength controller 1602 can selectively control creation of electric fields by the electronic devices in the solution 1608 (e.g., the solution 502 of FIG. 5). For instance, a first wavelength of light applied to the electronic devices in the solution 1608 can be applied by the light source 106 as controlled by the wavelength controller 1602. The first wavelength of the light can selectively cause a first subset of the electronic devices to generate electric fields (e.g., the electronic device 1604 can generate an electric field whereas the electronic device 1606 does not generate an electric field responsive to the first wavelength of the light). Further, a second wavelength of light can be applied to the electronic devices in the solution 1608 as controlled by the wavelength controller 1602. The second wavelength of the light can selectively cause a second subset of the electronic devices to generate electric fields (e.g., the electronic device 1606 can generate an electric field whereas the electronic device 1604 does not generate an electric field responsive to the second wavelength of the light).

Thus, the wavelength controller 1602 can select a type of cell that is actively being functionalized and/or assembled, where electronic devices that include multiple types of photovoltaic cells can be in the solution 1608. For example, the wavelength controller 1602 can initially cause the light source 106 to emit infrared light; thus, electronic devices that include photovoltaic cells having a lowest bandgap can be activated responsive to such light, which can cause such electronic devices having photovoltaic cells with the lowest bandgap to be assembled. Next, the wavelength controller 1602 can cause the light source 106 to emit red light, which can cause electronic devices that include photovoltaic cells formed of silicon to be assembled. Thereafter, the wavelength controller 1602 can cause the light source 106 to emit blue light, which can cause electronic devices that include higher bandgap photovoltaic cells (which do not absorb red or infrared light) to be activated. It is to be appreciated, however, that the claimed subject matter is not limited to the foregoing example.

Figure 17:
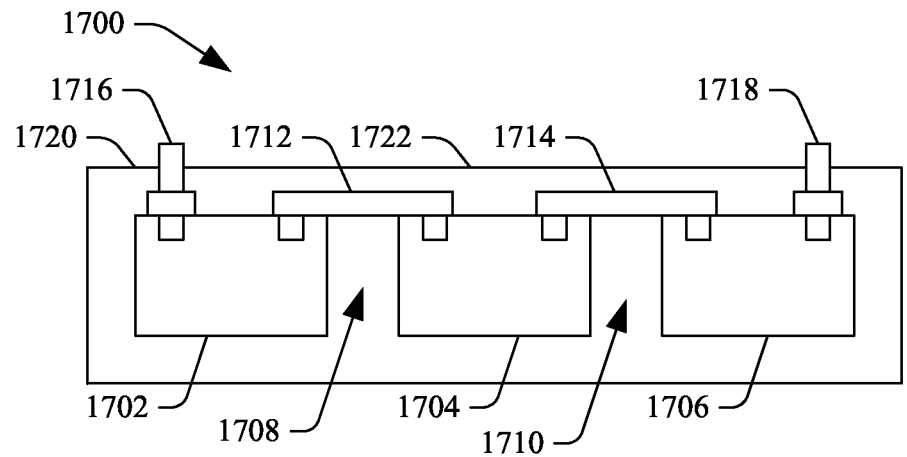
FIGS. 17-19 illustrate various exemplary electronic devices.

The electronic devices described herein can be microscale electronic devices or nanoscale electronic devices. FIG. 17 depicts a cross-sectional view of an exemplary electronic device 1700 (e.g., the electronic device 102, the electronic devices 604, etc.). The electronic device 1700 includes a plurality of photovoltaic cells 1702-1706. Moreover, the electronic device 1700 can be fabricated to provide additional functionality. While the electronic device 1700 of FIG. 17 is shown to include three photovoltaic cells 1702-1706, it is contemplated that the electronic device 1700 can include substantially any number of photovoltaic cells. The photovoltaic cells 1702-1706 are separated by trenches 1708-1710. The trenches 1708-1710 provide electrical isolation between the photovoltaic cells 1702-1706. Moreover, the photovoltaic cells 1702-1706 are electrically connected by metal lines 1712-1714. It to be appreciated that this photovoltaic cells 1702-1706 can be electrically connected in series, in parallel, or a combination thereof (e.g., the metal lines 1712-1714 are depicted to electrically connect the photovoltaic cells 1702-1706 in series in the illustrated example of FIG. 17).

Further, the electronic device 1702 includes two electrodes 1716-1718. The electrode 1716 can be electrically connected to a first one of the photovoltaic cells (e.g., the photovoltaic cell 1702) and the electrode 1718 can be electrically connected to a second one of the photovoltaic cells (e.g., the photovoltaic cell 1706). As depicted in FIG. 17, the electrodes 1716-1718 are on a common face 1720 of the electronic device 1700; yet, according to other embodiments, it is contemplated that electrodes of an electronic device can be on differing faces of such electronic device. The electrodes 1716-1718 can have a certain shape or size to achieve a desired field or current when the electronic device 1700 has light applied thereto. Moreover, an insulating layer 1722 can be formed upon the metal lines 1712-1714.

Figure 18:
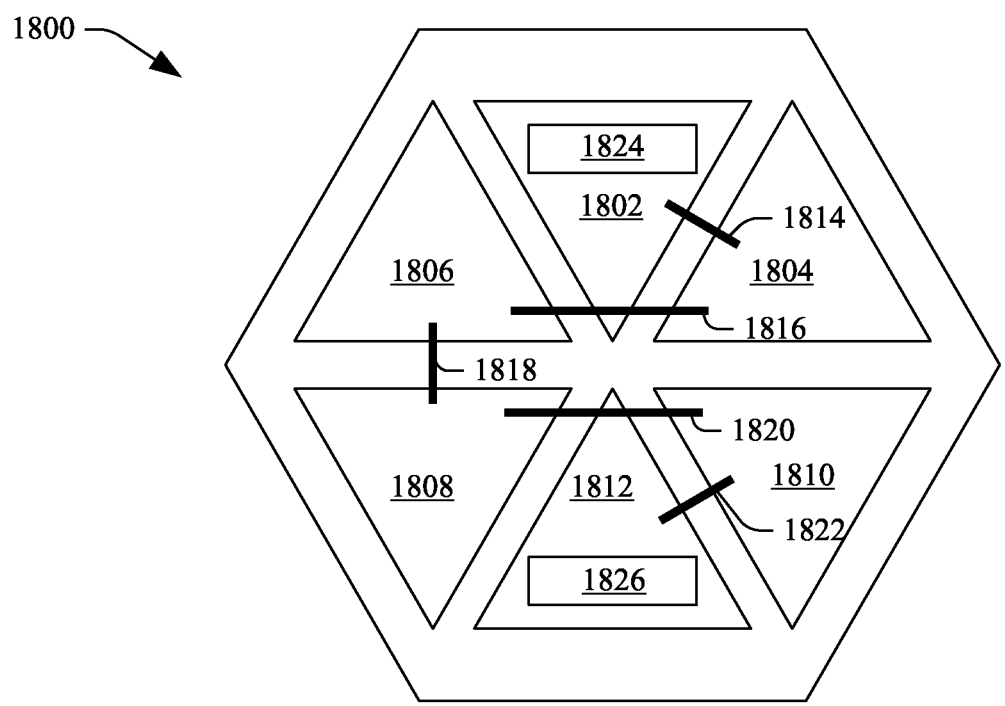

With reference to FIG. 18, illustrated is a top view of an exemplary electronic device 1800 (e.g., the electronic device 102, the electronic devices 604, the electronic device 1700, etc.). The electronic device 1800 has a hexagonal shape. Moreover, the electronic device 1800 includes six electronic cells 1802-1812, each having a triangular shape; yet, again, it is contemplated that the electronic device 1800 can include more or less than six photovoltaic cells and shapes other than hexagonal. Further, the photovoltaic cells 1802-1812 are separated by trenches.

As depicted in FIG. 18, the photovoltaic cells 1802-1812 are electrically connected in series by metal lines 1814-1822. Moreover, the electronic device 1800 includes electrodes 1824-1826 on a common face of the electronic device 1800.

While the photovoltaic cells 1802-1812 are depicted as being electrically connected in series, it is to be appreciated that the photovoltaic cells 1802-1812 can alternatively be connected electrically in parallel, for example. According to another example, groups of the photovoltaic cells 1802-1812 can be electrically connected in series, and each of those groups can be connected electrically in parallel. Thus, by way of illustration, the photovoltaic cells 1802-1806 can be electrically connected in series and the photovoltaic cells 1808-1812 can be electrically connected in series. Further, the series-connected group of photovoltaic cells 1802-1806 can be electrically connected in parallel with the series-connected group of photovoltaic cells 1808-1812; yet, the claimed subject matter is not so limited.

Figure 19:
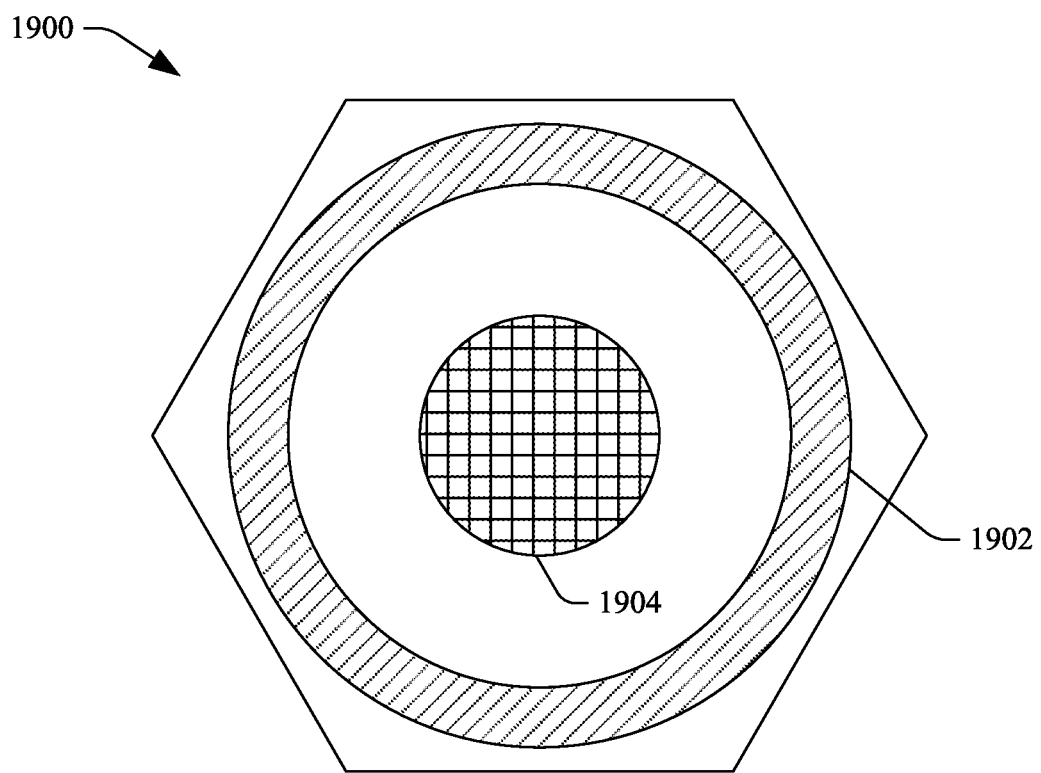

Turning to FIG. 19, illustrated is a top view of another exemplary electronic device 1900. The electronic device 1900 has a differing electrode configuration for controlling electric fields and currents produced responsive to applied light. The electronic device 1900 includes an electrode 1902 and an electrode 1904. While FIGS. 18-19 show two exemplary electrode configurations, it is to be appreciated that substantially any electrode configuration for an electronic device is intended to fall within the scope of the hereto appended claims.

Figure 20:
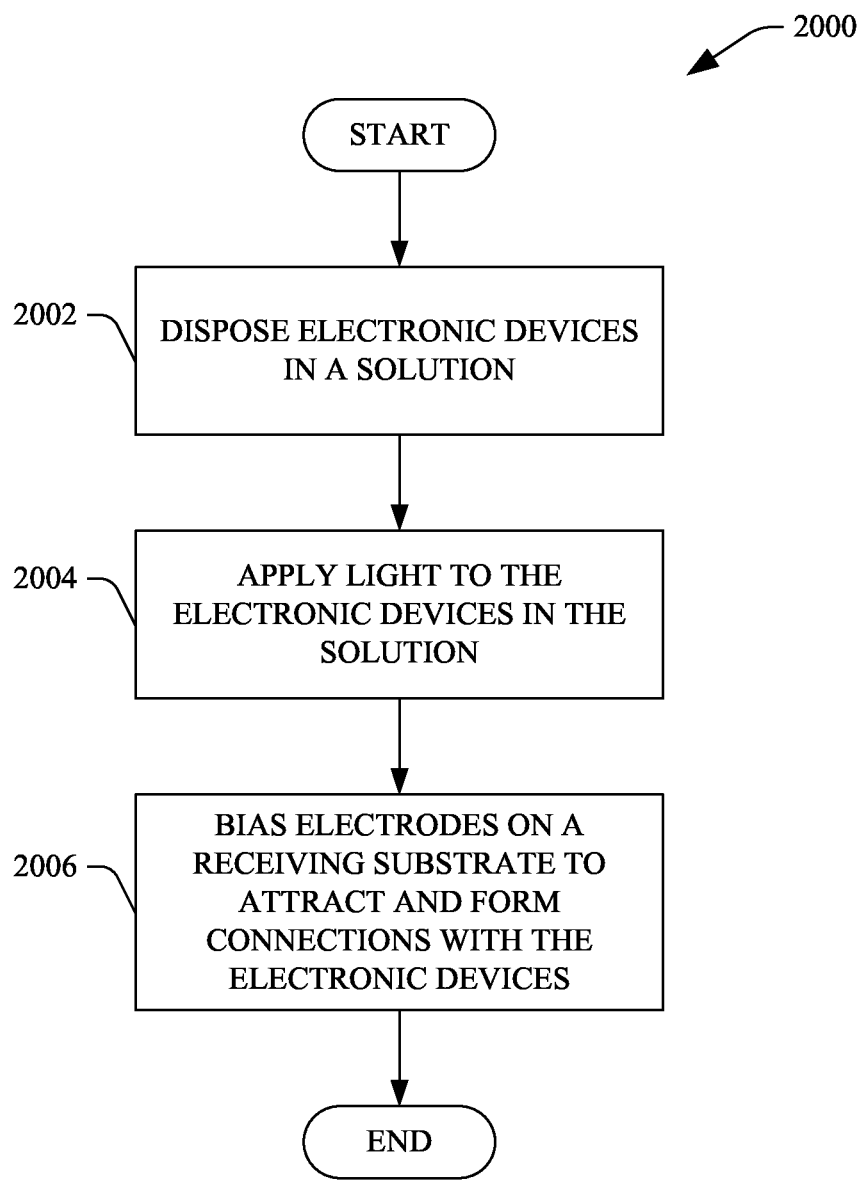
FIG. 20 is a flow diagram that illustrates an exemplary methodology for assembling electronic devices into a microsystem.

FIG. 20 illustrates an exemplary methodology relating to photoelectrochemically driven self-assembly of microsystems. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

FIG. 20 illustrates a methodology 2000 for assembling electronic devices into a microsystem. At 2002, electronic devices can be disposed in a solution. At 2004, light can be applied to the electronic devices in the solution. According to an example, the electronic devices can generate currents responsive to the light applied to the electronic devices in the solution. Further following this example, the currents can cause electrochemical reactions that functionalize regions on surfaces of the electronic devices. Additionally or alternatively, the light applied to the electronic devices in the solution (and/or a differing solution) can cause the electronic devices to generate electric fields. Following this example, the electric fields generated by the electronic devices responsive to the applied light can orient the electronic devices with respect to a receiving substrate and/or induce movement of the electronic devices with respect to the receiving substrate. At 2006, electrodes on the receiving substrate can be biased to attract and form connections with the electronic devices. Accordingly, the microsystem can include the receiving substrate and the electronic devices connected to the receiving substrate.

Further, as used herein, the term "exemplary" is intended to mean "serving as an illustration or example of something."

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method of assembling electronic devices into a microsystem, comprising:
   disposing the electronic devices in a solution;
   applying light to the electronic devices in the solution, wherein the electronic devices generate currents responsive to the light applied to the electronic devices in the solution, and wherein the currents cause electrochemical reactions that functionalize regions on surfaces of the electronic devices; and
   biasing electrodes on a receiving substrate to attract and form connections with the electronic devices having the functionalized regions on the surfaces, wherein the microsystem comprises the receiving substrate and the electronic devices connected to the receiving substrate;
   wherein an electronic device from the electronic devices comprises a plurality of electrically coupled photovoltaic cells separated by trenches, wherein the plurality of electrically coupled photovoltaic cells are electrically coupled to two electrodes, and wherein the two electrodes are on a common face of the electronic device.

2. A method of assembling electronic devices into a microsystem, comprising:
   disposing the electronic devices in a solution;
   applying light to the electronic devices in the solution, wherein:
      the electronic devices generate electric fields responsive to the light applied to the electronic devices, and
      the electric fields at least one of orient the electronic devices with respect to a receiving substrate or induce movement of the electronic devices with respect to the receiving substrate; and
   biasing electrodes on a receiving substrate to attract and form connections with the electronic devices, wherein the microsystem comprises the receiving substrate and the electronic devices connected to the receiving substrate;
   wherein applying the light to the electronic devices in the solution further comprises:
   applying a first wavelength of the light to the electronic devices in the solution, wherein the first wavelength of the light selectively causes a first subset of the electronic devices to generate the electric fields; and applying a second wavelength of the light to the electronic devices in the solution, wherein the second wavelength of the light selectively causes a second subset of the electronic devices to generate the electric fields.

3. A method of assembling electronic devices into a microsystem that comprises a receiving substrate to which the electronic devices are connected, comprising:

disposing the electronic devices in a first solution;

applying field-generating light to the electronic devices in the first solution and thereby causing the electronic devices to generate electric fields responsive to the field-generating light applied to the electronic devices; and biasing electrodes on a receiving substrate to attract and form connections with the electronic devices, wherein:

the electric fields responsive to the applied field-generating light orient the electronic devices with respect to a receiving substrate, or the said electric fields induce movement of the electronic devices with respect to the receiving substrate, or the said electric fields both orient the electronic devices with respect to a receiving substrate and induce movement of the electronic devices with respect to the receiving substrate;

the electronic devices are disposed in the first solution or in a differing solution prior to generation of the electric fields; and the method further comprises applying functionalizing light to the electronic devices in the first solution or in the differing solution prior to generation of the electric fields, wherein the electronic devices generate currents responsive to the functionalizing light applied to the electronic devices in the first solution or in the differing solution, and wherein the currents cause electrochemical reactions that functionalize regions on surfaces of the electronic devices.

4. The method of claim 3, further comprising applying light to the electronic devices when connected to the receiving substrate to strengthen the connections between the electronic devices and the receiving substrate.

5. The method of claim 3, further comprising supplying electrical currents between the electrodes on the receiving substrate through the electronic devices connected to the receiving substrate to strengthen the connections between the electronic devices and the receiving substrate.

6. The method of claim 3, further comprising:

fabricating the electronic devices on a fabrication surface; and releasing the electronic devices from the fabrication surface, wherein the electronic devices released from the fabrication surface are disposed in the first solution or in the differing solution, and wherein the functionalizing light is applied to the electronic devices in the first solution or in the differing solution subsequent to the electronic devices being released from the fabrication surface to at least partially functionalize regions on the surfaces of the electronic devices.

7. The method of claim 3, further comprising:

fabricating the electronic devices on a fabrication surface;

disposing the electronic devices in the first solution while the electronic devices are attached to the fabrication surface;

applying the functionalizing light to the electronic devices in the first solution while the electronic devices are attached to the fabrication surface to at least partially functionalize the regions on the surfaces of the electronic devices; and subsequent to application of the functionalizing light to the electronic devices in the first solution while the electronic devices are attached to the fabrication surface, releasing the electronic devices from the fabrication surface.

8. The method of claim 3, wherein the electronic devices and the receiving substrate are disposed in the first solution or in the differing solution subsequent to the regions on the surfaces of the electronic devices being functionalized, the method further comprising:

supplying an electric field to the first solution or to the differing solution in which the electronic devices and the receiving substrate are disposed;

wherein the electric field orients the electronic devices with respect to the receiving substrate, or the electric field induces movement of the electronic devices with respect to the receiving substrate, or the electric field both orients the electronic devices with respect to the receiving substrate and induces movement of the electronic devices with respect to the receiving substrate.

9. The method of claim 3, wherein:

the electronic devices and the receiving substrate are disposed in the first solution or in the differing solution subsequent to the regions on the surfaces of the electronic devices being functionalized; and interactions between the electronic devices, as functionalized, and the first solution or the differing solution cause at least one of:

orientation of the electronic devices with respect to the receiving substrate; or inducement of movement of the electronic devices with respect to the receiving substrate.

10. The method of claim 3, further comprising mechanically guiding the electronic devices to the electrodes on the receiving substrate.

11. The method of claim 3, further comprising mechanically orienting the electronic devices with respect to the receiving substrate.

12. The method of claim 3, wherein the first solution is an ionic, conductive solution.

13. The method of claim 3, wherein applying the functionalizing light to the electronic devices in the first solution or in the differing solution further comprises:

applying a first wavelength of the light to the electronic devices in the first solution or in the differing solution, wherein the first wavelength of the light causes selective functionalization of the regions on the surfaces of a first subset of the electronic devices; and applying a second wavelength of the light to the electronic devices in the first solution or in the differing solution, wherein the second wavelength of the light causes selective functionalization of the regions on the surfaces of a second subset of the electronic devices.

14. The method of claim 3, wherein the electronic devices and the receiving substrate are disposed in the differing solution subsequent to the regions on the surfaces of the electronic devices being functionalized, and wherein the differing solution is a non-ionic, non-conductive solution.

15. The method of claim 3, wherein an electronic device from the electronic devices comprises a plurality of electrically coupled photovoltaic cells separated by trenches, wherein the plurality of electrically coupled photovoltaic cells are electrically coupled to two electrodes, and wherein the two electrodes are on a common face of the electronic device.

16. The method of claim 3, wherein applying the field-generating light to the electronic devices in the first solution further comprises:
   applying a first wavelength of the light to the electronic devices in the solution, wherein the first wavelength of the light selectively causes a first subset of the electronic devices to generate the electric fields; and
   applying a second wavelength of the light to the electronic devices in the solution, wherein the second wavelength of the light selectively causes a second subset of the electronic devices to generate the electric fields.

17. The method of claim 3, wherein the electrochemical reactions that functionalize regions on surfaces of the electronic devices produce changes in surface charge where the surfaces are functionalized.

18. The method of claim 3, wherein the electrochemical reactions that functionalize regions on surfaces of the electronic devices produce changes in reactivity where the surfaces are functionalized.

19. The method of claim 3, wherein the electrochemical reactions that functionalize regions on surfaces of the electronic devices make the surfaces more hydrophobic or more hydrophilic where they are functionalized.

20. The method of claim 3, wherein the electrochemical reactions that functionalize regions on surfaces of the electronic devices make the surfaces more oleophobic or more oleophilic where they are functionalized.

* * * * *